(12) United States Patent
Kim (10) Patent No.: US 10,845,631 B2
(45) Date of Patent: Nov. 24, 2020

(54) DISPLAY DEVICE

(71) Applicant: LG DISPLAY CO., LTD., Seoul (KR)

(72) Inventor: JaeHo Kim, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/000,417

(22) Filed: Jun. 5, 2018

(65) Prior Publication Data

US 2019/0064577 A1 Feb. 28, 2019

(30) Foreign Application Priority Data

Aug. 30, 2017 (KR) .................. 10-2017-0110506

(51) Int. Cl.
*G02F 1/1333* (2006.01)
*G02F 1/13357* (2006.01)
*H05K 7/14* (2006.01)

(52) U.S. Cl.
CPC .. *G02F 1/133308* (2013.01); *G02F 1/133305* (2013.01); *G02F 1/133603* (2013.01); *G02F 2001/13332* (2013.01); *G02F 2001/133314* (2013.01); *G02F 2001/133354* (2013.01); *H05K 7/14* (2013.01)

(58) Field of Classification Search
CPC ......... G02F 1/133308; G02F 1/133305; G02F 2001/133354; H05K 7/14
See application file for complete search history.

(56) References Cited

U.S. PATENT DOCUMENTS

| 2009/0027583 | A1* | 1/2009 | McBroom ............. | G06F 1/1601 349/58 |
| 2011/0310545 | A1* | 12/2011 | Liu .................... | G02F 1/133308 361/679.01 |
| 2014/0118910 | A1 | 5/2014 | Sung et al. | |
| 2014/0126227 | A1 | 5/2014 | Yoon et al. | |
| 2015/0192952 | A1* | 7/2015 | Jung .................... | G06F 1/1652 361/747 |
| 2015/0340004 | A1 | 11/2015 | Pang | |
| 2016/0202726 | A1* | 7/2016 | Seen .................... | G02B 6/0088 349/42 |
| 2017/0094813 | A1* | 3/2017 | Taniguchi ............ | H05K 5/0017 |

FOREIGN PATENT DOCUMENTS

| CN | 102200154 A | 9/2011 |
| CN | 204631406 U | 9/2015 |
| CN | 105009187 A | 10/2015 |
| CN | 105874523 A | 8/2016 |

(Continued)

OTHER PUBLICATIONS

English translation for JP2015219387, Yamaguchi (Year: 2015).*

*Primary Examiner* — Michael H Caley
*Assistant Examiner* — Jonathan Y Jung
(74) *Attorney, Agent, or Firm* — Birch, Stewart, Kolasch & Birch, LLP (57) ABSTRACT

A display device realizes a variety of curvatures as demanded by consumers without the provision of a curvature-changing device. The display device in one example includes a display panel, a back cover disposed on a rear surface of the display panel, and top cases coupled to the display panel and the back cover. The top cases are curved to impart a predetermined curvature to the display panel and the back cover.

8 Claims, 12 Drawing Sheets

(56) References Cited

FOREIGN PATENT DOCUMENTS

| | | | |
|---|---|---|---|
| CN | 106165003 | A | 11/2016 |
| CN | 106932941 | A | 7/2017 |
| JP | 2003-173872 | A | 8/2003 |
| JP | 2015-219387 | A | 12/2015 |
| JP | 2015219387 | A * | 12/2015 |

* cited by examiner

DISPLAY DEVICE

CROSS REFERENCE TO RELATED APPLICATION

This application claims priority to Korean Patent Application No. 10-2017-0110506, filed on Aug. 30, 2017 in the Republic of Korea, which is hereby incorporated by reference for all purposes as if fully set forth herein.

BACKGROUND

Field

The present disclosure relates to a display device. More particularly, the present disclosure relates to a display device able to realize a variety of curvatures as demanded by consumers, while using components, such as a back cover, in common with a flat panel display without restrictions in fabrication apparatuses, processes, or the like.

Description of Related Art

In general, research into flat panel display devices, such as liquid crystal display (LCD) devices, plasma display devices, field emission display devices, and organic light-emitting display devices, has been actively undertaken. Among such flat panel display devices, LCD devices and organic light-emitting display devices have recently come to prominence, due to the advantages thereof, such as adaptability to mass production, easy implementation of driving units, as well as the ability thereof to realize high resolution.

Recently, research into, and development of, curved display devices has been particularly required in terms of structures able to have higher consumer appeal, as well as technical aspects overcoming technical drawbacks.

In this regard, a demand for display devices that are curved at a curvature is gradually increasing.

According to the development of curved display devices that has been undertaken to date, a panel and a back cover have been shaped to have a predetermined curvature, with a fixing device having the same curvature as the back cover being coupled to a rear surface of the back cover, or a separate device for variably changing the curvature of the panel and the back cover has been coupled to the panel and the back cover.

However, in the structure in which a panel and a back cover have a predetermined curvature, a fixing device having the same curvature as the back cover being coupled to the rear surface of the back cover, jigs, as well as press processing, are required to set all parts, including the panel and the back cover, at a predetermined curvature. As such, a completed product can only remain at a constant curvature and cannot respond to the desire of consumers for a variety of curvatures, which is problematic.

Figure 1:
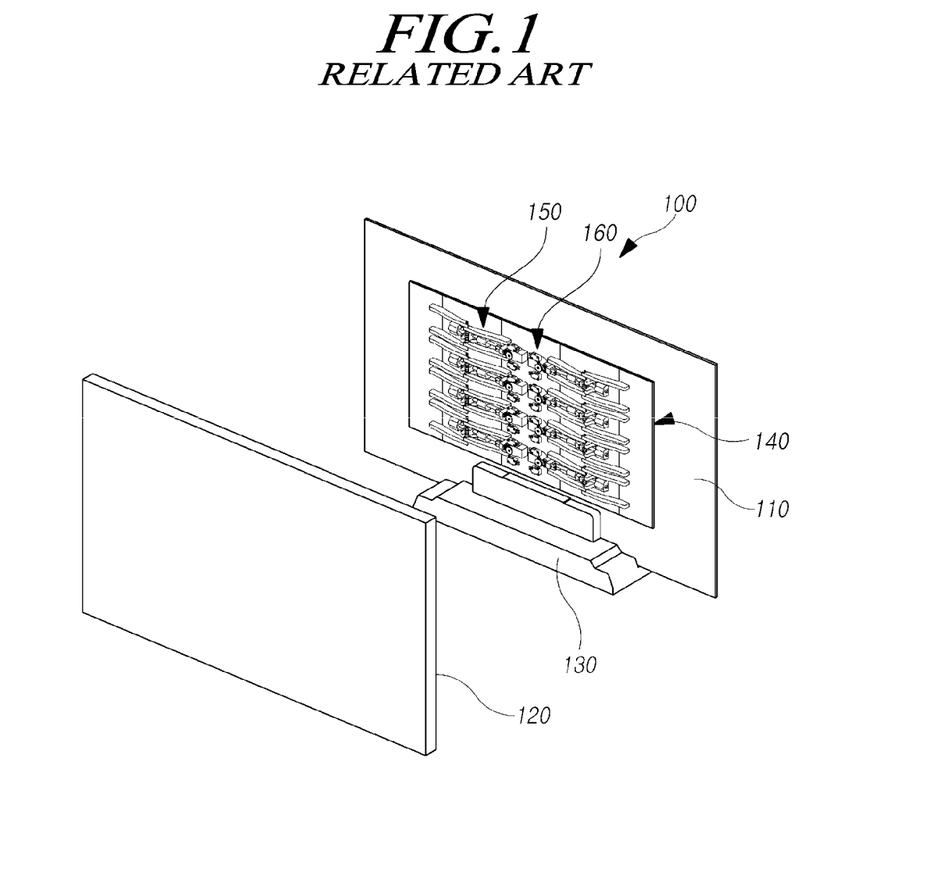
FIG. 1 is an exploded perspective view schematically illustrating a display device of the related art.

In another example, the structure in which a separate device for variably changing the curvature of a panel and a back cover is provided in a display device 100 of the related art, as illustrated in FIG. 1.

Referring to FIG. 1, the display device 100 includes a display panel 110, an outer case 120 holding the display panel 110, and a mount 130 connected to a bottom portion or a rear portion of the outer case 120 to be fixed to a desk or a wall surface.

The display device 100 is provided with a curvature-changing device 140 disposed on the rear surface of the display panel 110. The curvature-changing device 140 allows the display device 100 to selectively operate in a flat mode or a curved mode.

Specifically, a plurality of articulated plates 150 are connected to motors 160, respectively. The motors 160 drive the articulated plates 150 to be bent at predetermined angles, thereby changing the curvature of the display panel 110.

However, the above-described curved display device is configured such that the articulated plates of the curvature-changing device are attached to the rear surface of the display panel. This structure consequently increases the number of parts and processes required, as well as fabrication costs.

In addition, since this structure changes the curvature of the display device by the operation of the motors, this structure generates loud operation noise and increases power consumption. In addition, when the motor(s) malfunction, the outer case must be detached from the display panel before a repair can be performed. Accordingly, a significant amount of delay in the repair as well as user complaints can be caused.

Accordingly, research into a display device able to realize a variety of curvatures without being restricted by a fabrication apparatus or processes while providing a variety of curvatures demanded by consumers is necessary.

BRIEF SUMMARY

Various aspects of the present disclosure provide a display device that can realize a variety of curvatures as demanded by consumers without restrictions in fabrication apparatuses, processes, or the like. The display device does not require the provision of a curvature-changing device, thereby significantly reducing the number of parts and weight thereof.

Also provided is a display device that can use parts, such as a back cover, in common with a flat panel display device, thereby maximizing the utilization of common parts and simplifying fabrication.

The objects of the present disclosure are not limited to the aforementioned description, and other objects not explicitly disclosed herein will be clearly understood by a person skilled in the art from the description provided hereinafter.

Various embodiments provide a display device that can realize a variety of curvatures as demanded by consumers without the provision of a curvature-changing device. The display device can include a display panel, a back cover disposed on a rear surface of the display panel, and top cases coupled to the display panel and the back cover. The top cases are curved to impart a predetermined curvature to the display panel and the back cover.

According to embodiments, the display device can realize a variety of curvatures as demanded by consumers without restrictions in fabrication apparatuses, processes, or the like. The display device does not require the provision of a curvature-changing device, thereby significantly reducing the number of parts and weight thereof.

According to embodiments, when the top cases are fabricated at a variety of curvatures, a curved display device able to use parts, such as a back cover, in common with a flat panel display device can be provided at a variety of curvatures. This can consequently maximize the utilization of common parts and simplify fabrication.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION OF THE EMBODIMENTS

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure can be rendered unclear thereby.

It will also be understood that, while terms such as "first," "second," "A," "B," "(a)," and "(b)" can be used herein to describe various elements, such terms are merely used to distinguish one element from other elements. The substance, sequence, order, or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly located on or under another element, but it can also be indirectly located on or under another element via an intervening element.

Figure 2:
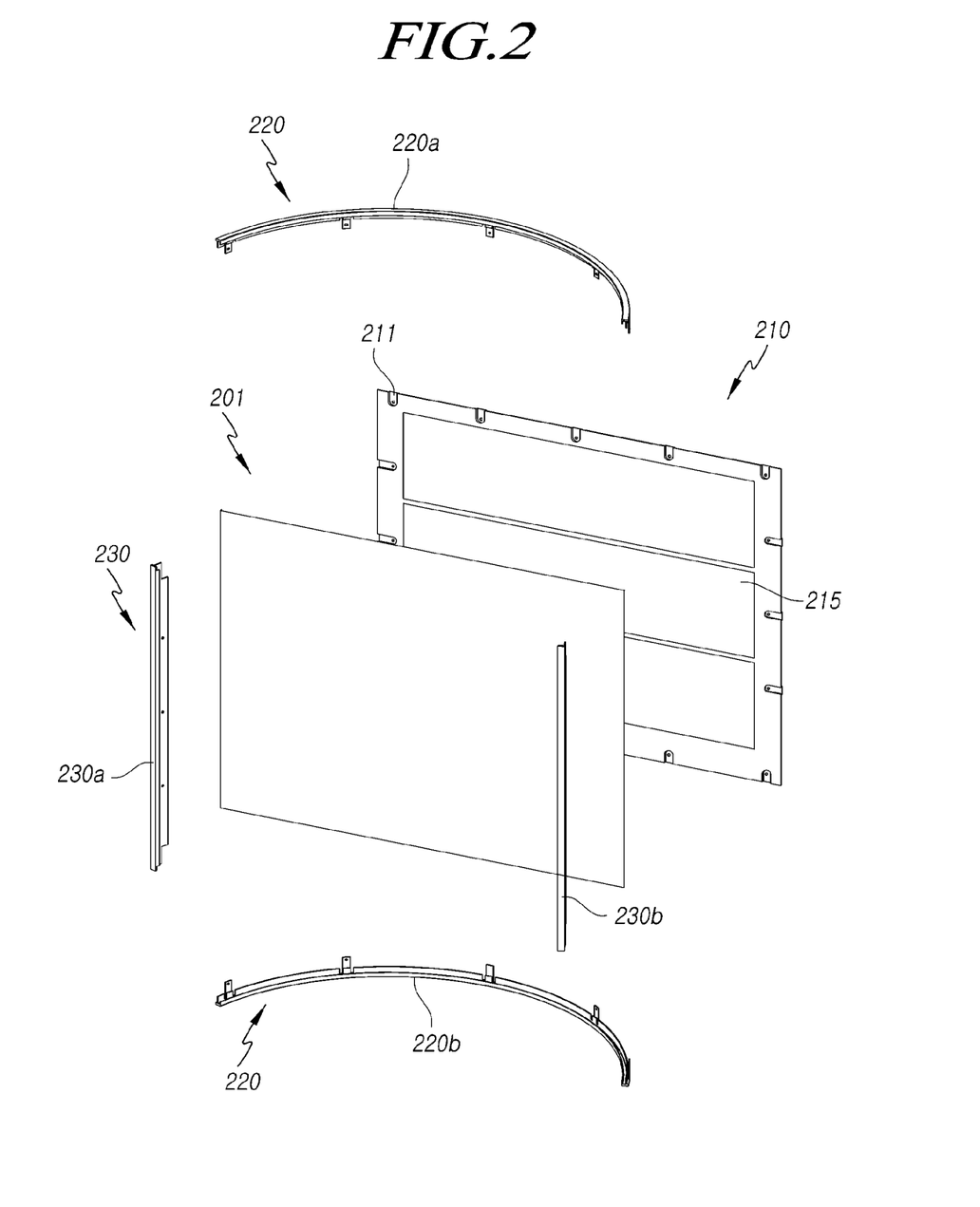
FIG. 2 is an exploded perspective view illustrating a display device according to exemplary embodiments.
Figure 3:
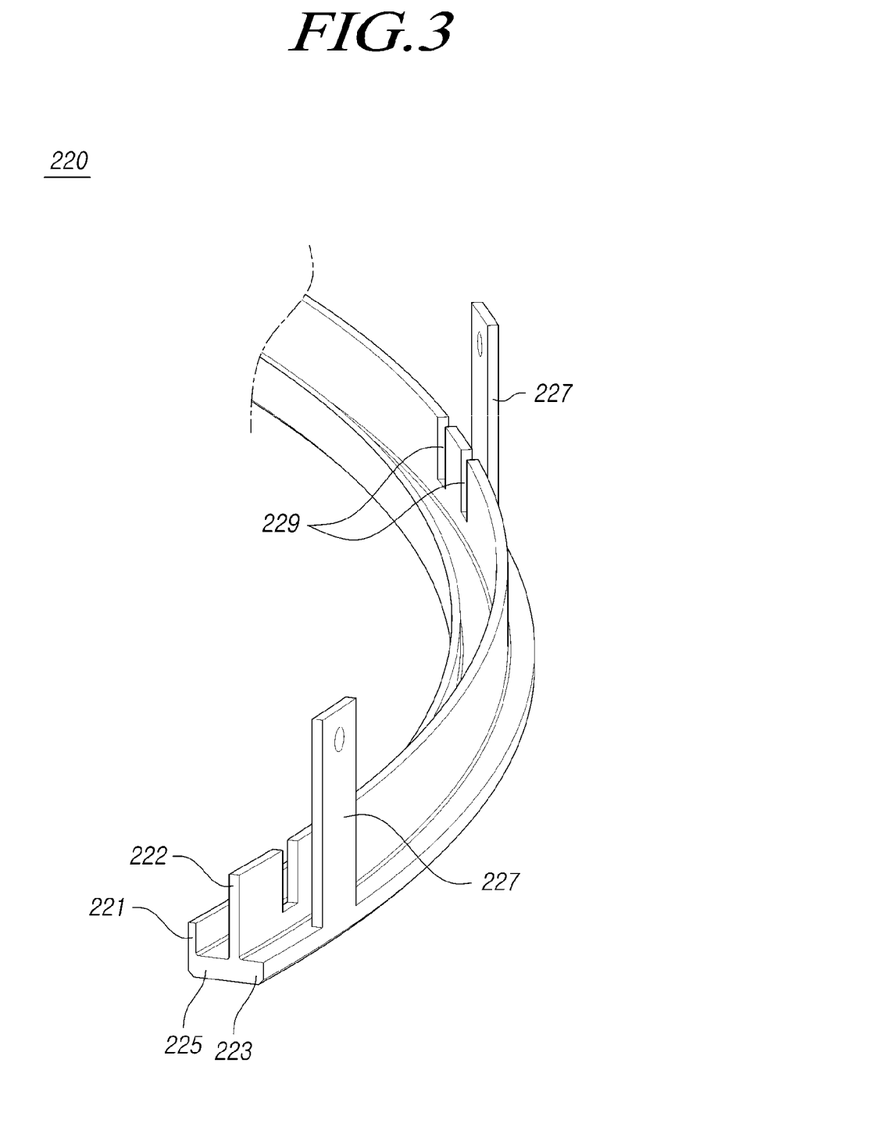
FIG. 3 is a perspective view illustrating a part of the display device according to exemplary embodiments.
Figure 4:
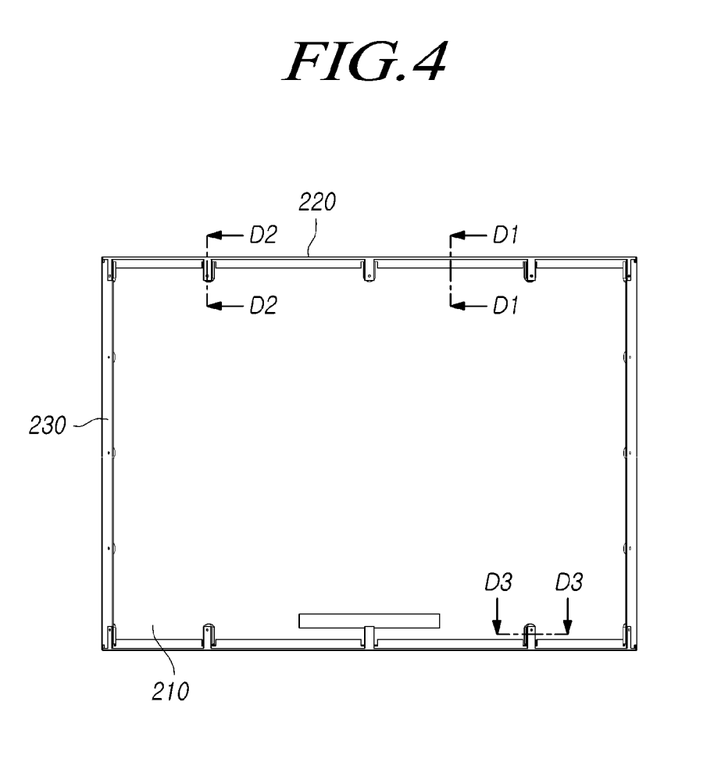
FIG. 4 is a rear view illustrating the display device according to exemplary embodiments.
Figure 5:
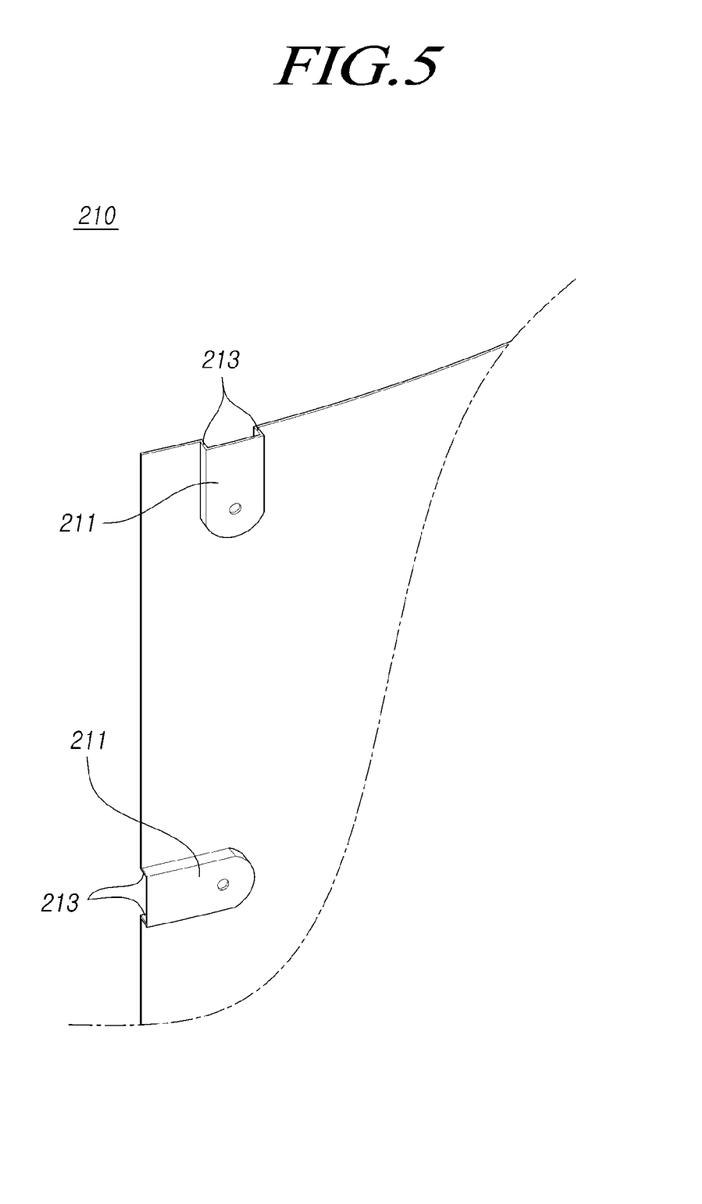
FIG. 5 is a perspective view illustrating a part of the display device according to exemplary embodiments.
Figure 6:
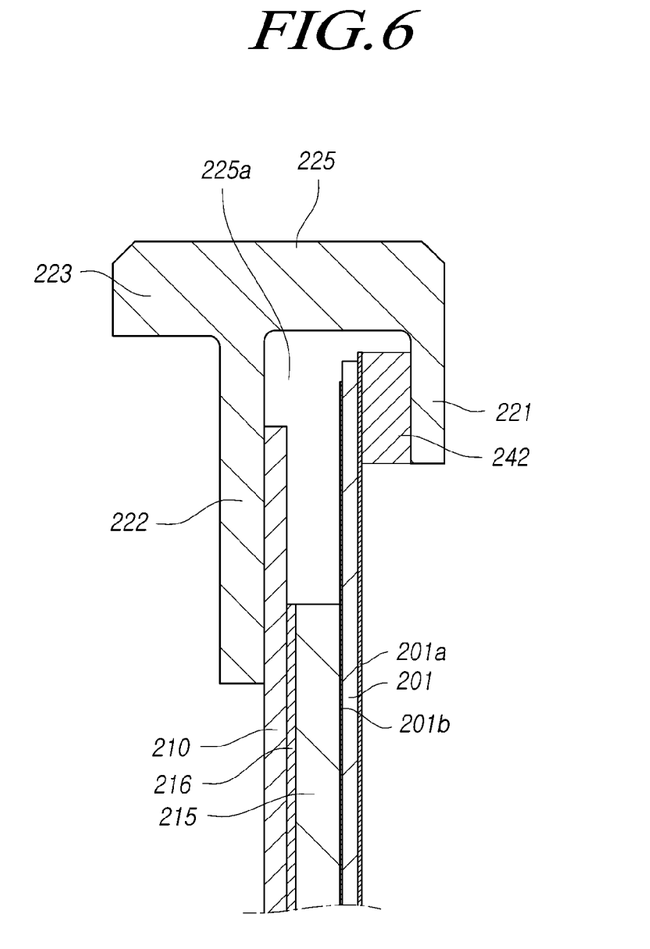
FIG. 6 is a cross-sectional view taken along line D1-D1 in FIG. 4.
Figure 7:
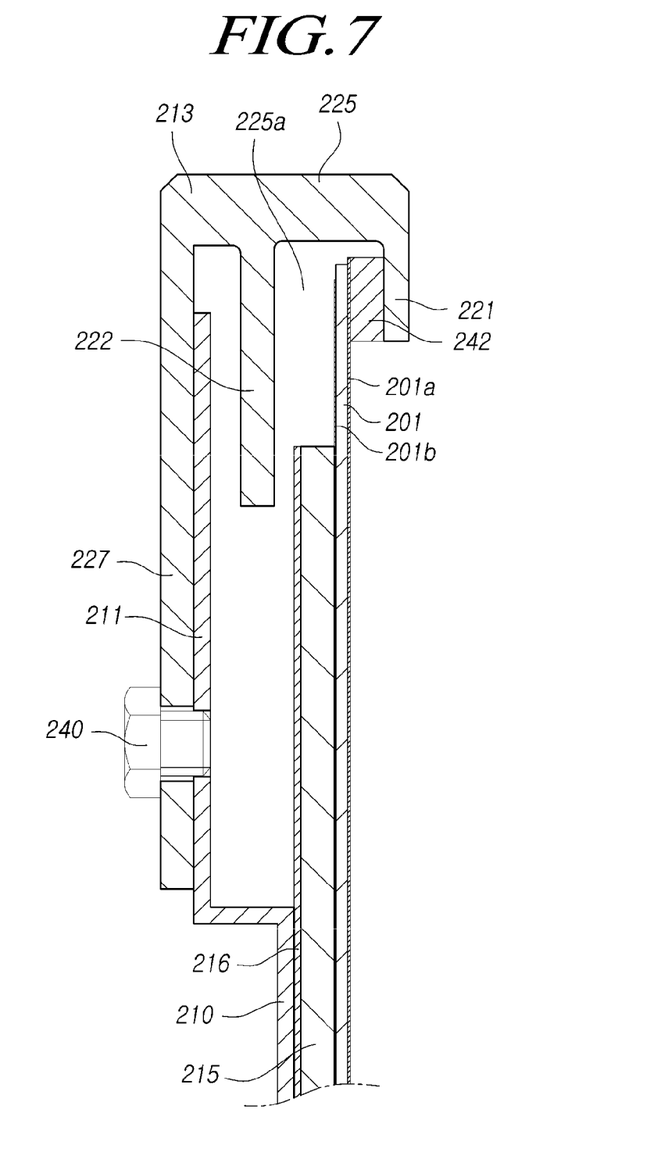
FIG. 7 is a cross-sectional view taken along line D2-D2 in FIG. 4.
Figure 8:
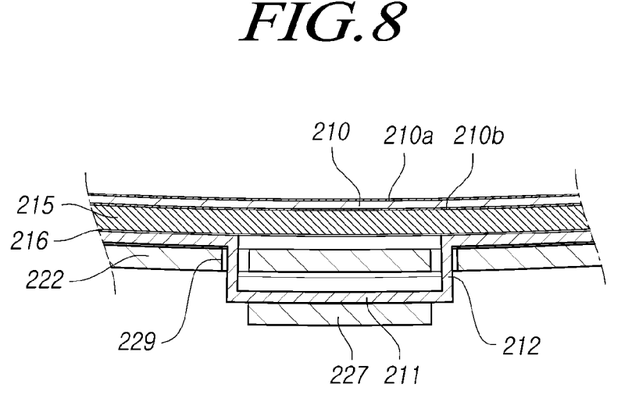
FIG. 8 is a cross-sectional view taken along line D3-D3 in FIG. 4.
Figure 9:
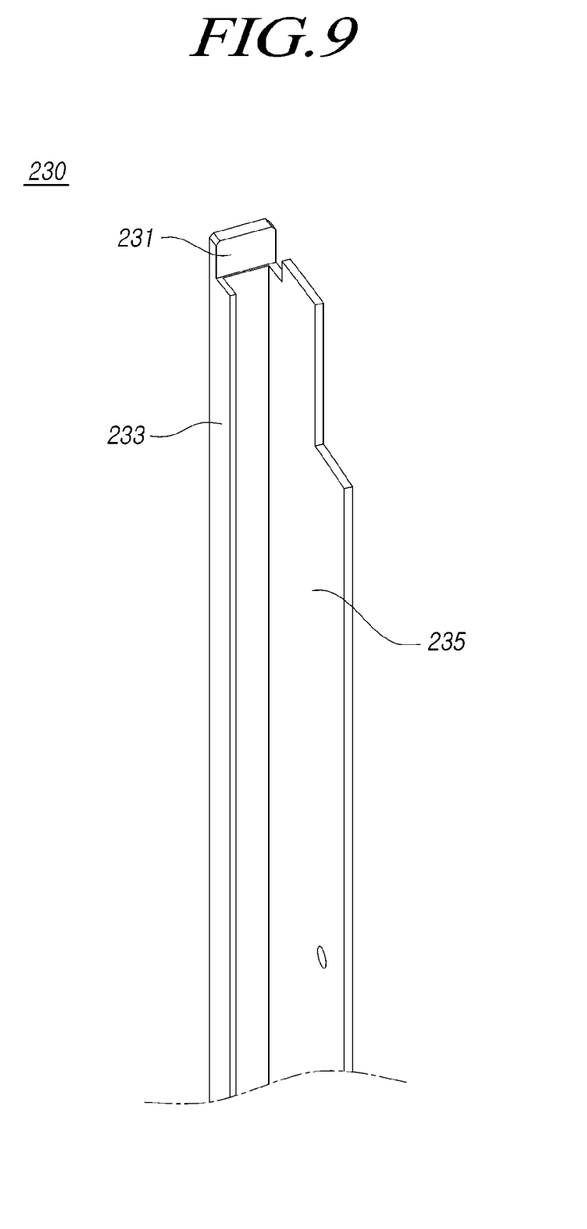
FIGS. 9 and 10 are perspective views illustrating parts of the display device according to exemplary embodiments.
Figure 10:
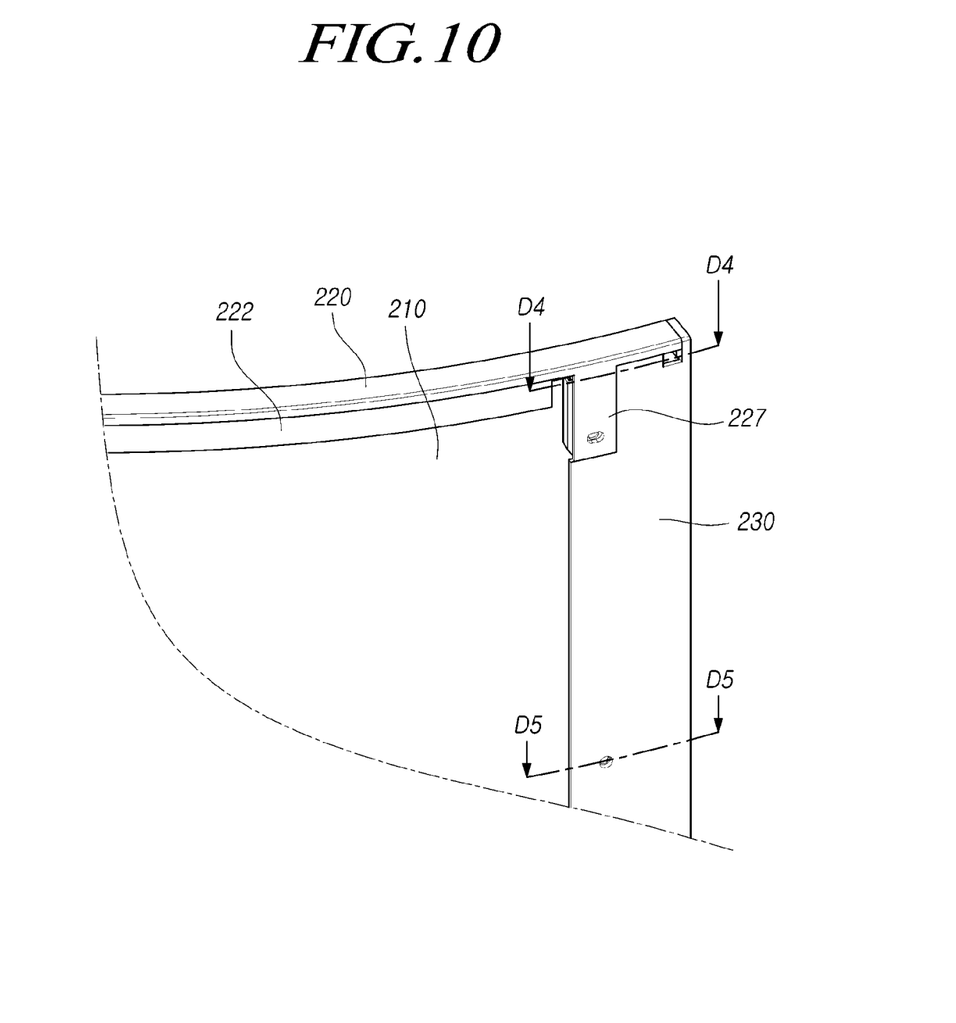
Figure 11:
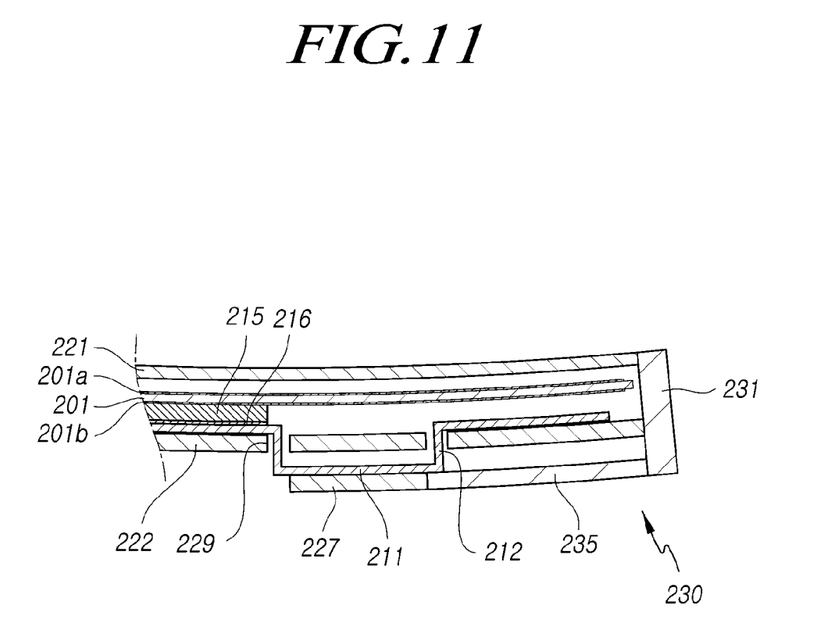
FIG. 11 is a cross-sectional view taken along line D4-D4 in FIG. 10.
Figure 12:
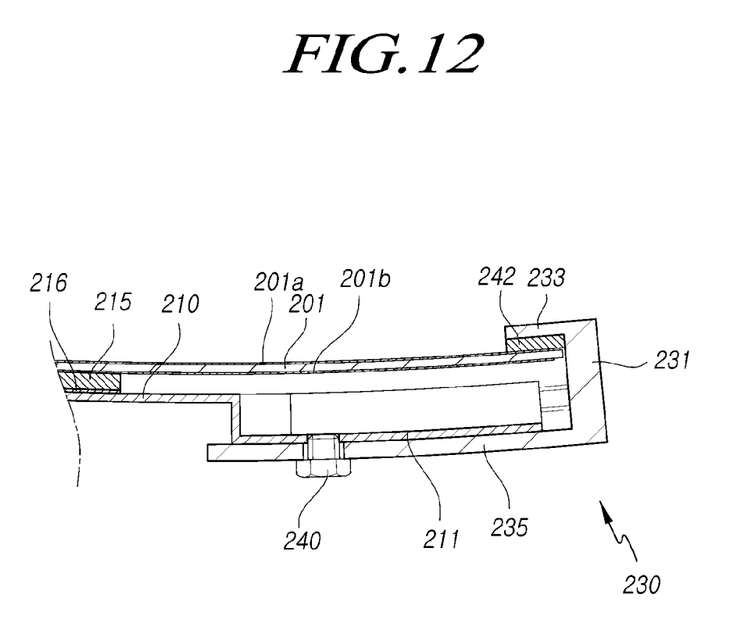
FIG. 12 is a cross-sectional view taken along line D5-D5 in FIG. 10.

FIG. 2 is an exploded perspective view illustrating a display device according to exemplary embodiments, FIG. 3 is a perspective view illustrating a part of the display device according to exemplary embodiments, FIG. 4 is a rear view illustrating the display device according to exemplary embodiments, FIG. 5 is a perspective view illustrating a part of the display device according to exemplary embodiments, FIG. 6 is a cross-sectional view taken along line D1-D1 in FIG. 4, FIG. 7 is a cross-sectional view taken along line D2-D2 in FIG. 4, FIG. 8 is a cross-sectional view taken along line D3-D3 in FIG. 4, FIGS. 9 and 10 are perspective views illustrating parts of the display device according to exemplary embodiments, FIG. 11 is a cross-sectional view taken along line D4-D4 in FIG. 10, and FIG. 12 is a cross-sectional view taken along line D5-D5 in FIG. 10. All the components of the display device according to all embodiments are operatively coupled and configured.

Referring to FIGS. 2-12, the display device according to exemplary embodiments includes a display panel 201, a back cover 210 disposed on the bottom of the display panel 201, and top cases 220 and 230 including a pair of first top cases 220 (220a, 220b) coupled to top and bottom edges of the display panel 201 and top and bottom edges of the back cover 210 and a pair of second top cases 230 (230a, 230b) coupled to lateral edges of the display panel 201 and lateral edges of the back cover 210. The first top cases 220 or the second top cases 230 are bent along a curve having a predetermined curvature.

According to exemplary embodiments, the display panel 201 and the back cover 210 are configured flat or curved and coupled to the top cases 220 and 230 to provide a curved display device having the same curvature as the top cases 220 and 230. In FIG. 2, the display panel 201 and the back cover 210 are illustrated as being flat by way of example only, and other examples are possible.

For example, the display device according to exemplary embodiments can provide a curved display device having the curvature of the top cases 220 and 230 coupled to the edges of the display panel 201, regardless of whether the display panel 201 is flat or curved.

In the drawings, the display device according to exemplary embodiments is illustrated by way of example as being a general cup-shaped curved display device having a concave front surface. However, the display device can be a cap-shaped display device having a convex front surface, due to the inversed curvature of the top cases, or can be a vertically or laterally elongated display device.

The first top cases 220 are coupled to the display panel 201 and the back cover 210, with the curvature thereof approximately ranging from 500 mm to 1000 mm.

The display panel 201 and the back cover 210 are coupled to provide the curved display device while being curved due to the curvature of the curved first top cases 220.

The display panel 201 according to exemplary embodiments can be used, regardless of whether the display panel 201 is a liquid crystal display (LCD) panel or a light-emitting display panel.

When the display panel 201 is an LCD panel, the display panel 201 can further include a backlight unit illuminating the LCD panel, a bottom polarizer panel attached to a bottom substrate, and a top polarizer panel attached to the front surface of a top substrate. The bottom substrate and the top substrate can have a variety of specific configurations known in the art, depending on the driving mode of the LCD panel, such as twisted nematic (TN) mode, vertical alignment (VA) mode, in-plane switching (IPS) mode, and fringe field switching (FFS) mode.

When the display panel 201 is light-emitting display panel, the display panel 201 can include a top substrate including a plurality of light-emitting cells provided in areas defined by gate lines, data lines, and power (VDD) lines, respectively, and a top substrate facing and attached to the bottom substrate.

Each of the plurality of light-emitting cells provided on the bottom substrate can include at least one switching transistor connected to a gate line and a data line, at least one driving transistor connected to a switching transistor and a power line, and a light-emitting device (e.g., an organic light-emitting diode (OLED)) emitting light in response to current controlled by the switching of the driving transistor.

The top substrate includes a moisture absorbent, or the like, to protect the light-emitting device from moisture or oxygen in the ambient air.

The top substrate can further include a light-emitting device connected to the driving transistor. In this case, the light-emitting device in the bottom substrate can be omitted.

According to exemplary embodiments, the display panel 201 is illustrated by way of example as being a light-emitting display panel. Since the light-emitting display panel 201 is configured to irradiate light by itself, the backlight unit emitting light is not illustrated. Hereinafter, the display panel 201 will be described as being a light-emitting display panel.

An organic compound contained in an array of pixels of the light-emitting display panel can be deteriorated when exposed to moisture or oxygen. To prevent the problem of deteriorated pixels, an encapsulation member 201b can be bonded to the rear surface of the display panel 201 to seal the array of pixels, e.g., as shown in FIGS. 4, 6 and 7.

The encapsulation member 201b can be a metal substrate or a glass substrate. As shown, e.g., in FIG. 8, a magnet member 215 can be provided between the encapsulation member 201b and the back cover 210 to be magnetically coupled to the back cover 210 made of a metal. An adhesive member 216 can be provided between the front surface of the back cover 210 and the rear surface of the magnet member 215 to prevent the magnetic member 215 from moving when pushed.

The bonding member 216 can be a double-sided tape, an adhesive heat conduction tape, or the like.

In addition, to prevent a light leakage phenomenon in which light from the array of pixels leaks through side surface of the display panel 201, side seal members can be provided on the side surfaces of the display panel 201. A polarizer film 201a can be bonded to the front surface of the display panel 201, e.g., as shown in FIGS. 7 and 8.

The side seal members can be made of a polymer material to which a black pigment is added. The side seal members absorb light irradiated thereto from the array of pixels, so that light exiting through the side surfaces of the display panel is not observed.

In addition, a plurality of flexible circuit films having driving integrated circuits (ICs) mounted thereon are electrically connected to the display panel 201 and a printed circuit board (PCB), on at least one portion of the rectangular rear surface of the display panel 201, adjacent to at least one edge of the display panel 201.

The plurality of flexible circuit films are attached to the display panel 201 and the PCB via a resin or the like by tape automated bonding (TAB). The plurality of flexible circuit films can be tape carrier packages (TCPs) or chip-on-flexible boards or chip-on-films (COFs).

Thus, the display panel 201 is electrically connected or joined to the PCB via the plurality of flexible circuit films. The PCB is electrically connected to the plurality of flexible circuit films to provide a variety of image display signals to the display panel 201.

The PCB is electrically connected to the plurality of flexible circuit films to provide a variety of image display signals to the display panel 201. Driving ICs or the like for controlling the driving of the display panel 201 are mounted on the PCB.

The vertical edges and lateral edges of the display panel 201 are coupled to the back cover 210 via the top cases 220 and 230.

The back cover 210 can be made of a metal material, such as aluminum (Al), aluminum alloy, stainless steel, or galvanized steel, a glass material, a plastic material, or the like. According to exemplary embodiments, the back cover can be made of any other material as long as the back cover can be bent at a predetermined curvature when coupled to the top cases 220 and 230.

The top cases 220 and 230 include a pair of first top cases 220 coupled the top and bottom edges of the display panel 201 and the top and bottom edges of the back cover 210 and a pair of second top cases 230 coupled to the lateral edges of the display panel 201 and the lateral edges of the back cover 210.

The first top cases 220 or the second top cases 230 are bent to have a predetermined curvature. When the first top cases 220 are bent at the predetermined curvature, a curved display device, the axis of curvature of which extends in the top-bottom direction, is provided. In contrast, when the second top cases 230 are bent at the predetermined curvature, a curved display device, the axis of curvature of which extends in the lateral direction, is provided. According to exemplary embodiments, as illustrated in the drawings, the top cases 220 are illustrated by way of example as being curved at the predetermined curvature.

Although the first top cases 220 according to the present embodiment are illustrated as being disposed in top and bottom portions, the first top cases 220 can be disposed on lateral portions (e.g., to the right and left) and the second top cases 230 can be disposed in top and bottom portions. Accordingly, the direction in which the first top cases 220 and the second top cases 230 are attached to the display device can be freely set, depending on the top-bottom or lateral layout of the display device.

As shown in FIG. 3, each of the first top cases 220 includes an outer support 225 covering the edge of the display panel 201 and a first support 221 protruding from the outer support 225 to support the front surface of the display panel 201. A damper 242 can be provided between the first support 221 and the display panel 201 to compensate for a gap therebetween.

When the display panel 201 is assembled according to the curvature of the first top cases 220, the edges and the front surface of the display panel 201 are supported by the outer supports 225 and the first supports 221, so that the curvature of the display panel 201 can be maintained at a constant value.

In addition, each of the first top cases 220 has a second support 222 protruding from the outer support 225 to support the rear surface of the back cover 210. The second support 222 is spaced apart from the first support 221 in a backward direction. Since the first support 221 and the second support 222 are provided as described above, the first support 221 and the second support 222 firmly support the front surfaces and the rear surfaces of the display panel 201 and the back cover 210, thereby suppressing the elastic resilience of the display panel 201 and the back cover 210 that would otherwise drive the display panel 201 and the back cover 210 to return to the flat shapes. Consequently, the curvature of the display panel 201 and the back cover 210 can be maintained at a constant value.

The first support 221 and the second support 222 are elongated in the circumferential direction of the first top case 220. The edges of the display panel 201 and the back cover 210 are seated in a grooved panel seat 225a between the first support 221 and the second support 222. The gap between the first support 221 and the second support 222, i.e., the width of the grooved panel seat 225a, can be set to be greater than a total thickness of the display panel 201, the magnet member 215, the adhesive member 216, and the back cover 210 by a predetermined value in order to facilitate assembly.

Thus, when the display panel 201 and the back cover 210 are seated in the grooved portion 225a between the first support 221 and the second support 222, this configuration protects the edges of the display panel 201 and the back cover 210 while suppressing the elastic resilience returning the display panel 201 and the back cover 210 to the flat shapes. Consequently, the curvature of the display panel 201 and the back cover 210 can be maintained at a constant value.

In addition, each of the top cases 220 can be provided with a third support 223 protruding backward from the outer support 225 to a position spaced part from the second support 222. The provision of the third support 223 increases the bending strength of the first top case 220. This can consequently increase the ability to maintain the constant curvature of the display panel 201 and the back cover 210 while supporting the display panel 201 and the back cover 210.

Two or more coupling supports 227 can be provided on the third support 223. The coupling supports 227 are bent from the edge of the third support 223 and are spaced apart from each other in the circumferential direction. According to this configuration, the back cover 210 and the coupling supports 227 are coupled via fastening members 240 (FIG. 7). The fastening members 240 can fix the coupling supports 227 to the back cover 210 while reinforcing the strength of portions of the coupling supports 227 fixed to the back cover 210.

As shown in FIG. 5, the back cover 210 is provided with rear stepped portions 211 protruding backward, in positions corresponding to the coupling supports 227 of the first top case 220. The rear stepped portions 211 protruding from the back cover 210 are coupled to the coupling supports 227 via the fastening members 240. This configuration can consequently increase the strength of the coupled portions of the back cover 210, so that the curved surface of the back cover 210 can be maintained at a constant curvature without defects, such as localized pits or protrusions.

In addition, the second support 222 can be provided with slits 229 in positions corresponding to the rear stepped portions 211. Bent portions 213 provided on both sides of the rear stepped portions 211 are fitted into and supported by the slits 229.

The slits 229 are opened toward the distal edge of the second support 222. This configuration allows the bent portions 213 of the rear stepped portions 211 are fitted into the slits 229 when the first top case 220 is coupled to the back cover 210. Consequently, the first top case 220 can be accurately located in an assembly position when coupled to the back cover 210. After first top case 220 is coupled to the back cover 210, the rear stepped portions 211 can be supported between the second support 222 and the coupling supports 227, thereby being prevented from moving in a lateral direction when pushed.

As shown in FIGS. 9-12, each of the second top cases 230 can include a side support 231 covering predetermined ends of the first top cases 220 and a front support 233 bent from the front edge of the side support 231 to support the display panel 201. A gap-compensating damper 242 can be provided between the front support 233 and the display panel 201.

Consequently, this configuration can firmly couple the second top cases 230 to the first top cases 220 while preventing the side surfaces of the first top cases 220 from being exposed externally. In addition, the edges of the display panel 201 can be protected from external impact.

In addition, the rear stepped portions 211, provided on the lateral edges of the back cover 210, protrude backward in a stepped shape. Each of the second top cases 230 has a rear support 235 bent from the rear edge of the side support 231 to support the rear surfaces of the rear stepped portions 211 of the back cover 210. According to this configuration, the rear support 235 of the second top case 230 is coupled to the back cover 210 using fastening members 240. This can consequently prevent the side surfaces of the first top cases 220 from being exposed externally while firmly coupling the first top cases 220 to the back cover 210.

Although the display panel according to exemplary embodiments has been illustrated by way of example as being a light-emitting display panel, exemplary embodiments are applicable to cases in which the display panel is an LCD panel. In this case, a backlight module illuminating the LCD panel includes a light source module, a lightguide plate processing light, emitted by the light source module, to be suitable for the LCD panel, a light adjustment member, a reflector, and the like. The light source module is a part that converts electrical energy/signals into light. The light source module can be implemented as one selected from among, but not limited to, a light-emitting diode (LED) assembly, a cold cathode fluorescent lamp (CCFL), and a hot cathode fluorescent lamp (HCFL). Since the light source module is well known in the art to which exemplary embodiments belong, detailed descriptions thereof will be omitted.

As set forth above, according to exemplary embodiments, the display device can realize a variety of curvatures as demanded by consumers without restrictions in fabrication apparatuses, processes, or the like. The display device does not require the provision of a curvature-changing device, thereby significantly reducing the number of parts and weight thereof.

In addition, according to exemplary embodiments, when the top cases are fabricated at a variety of curvatures, curved display device able to use parts, such as a back cover, in common with a flat panel display device can be provided at a variety of curvatures. This can consequently maximize the utilization of common parts and simplify fabrication.

Although all of the components constituting exemplary embodiments have been described as being combined together or as operating in concert with each other, the present disclosure is not necessarily limited thereto. Rather, one or more components can be selected from the entire components to be combined together and operate in a combined form within the scope of the present disclosure.

It will be understood that the terms "comprise," "include," "have," and any variations thereof used herein are intended to cover non-exclusive inclusions unless explicitly described to the contrary. Unless otherwise defined, all terms including technical and scientific terms used herein have the same meaning as commonly understood by a person skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing embodiments disclosed herein shall be interpreted as illustrative only but not as limitative of the principle and scope of the present disclosure. It should be understood that the scope of the present disclosure shall be defined by the appended claims and all of their equivalents fall within the scope of the present disclosure.

What is claimed is:

1. A display device comprising:
   a display panel;
   a back cover disposed on a rear surface of the display panel; and
   top cases comprising a pair of first top cases coupled to top and bottom edge surfaces of the display panel and top and bottom edge surfaces of the back cover, respectively, and a pair of second top cases coupled to lateral edge surfaces of the display panel and lateral edge surfaces of the back cover, respectively,
   wherein the top and bottom edge surfaces of the display panel extend between the lateral edge surfaces of the display panel,
   wherein the top and bottom edge surfaces of the back cover extend between the lateral edge surfaces of the back cover,
   wherein the first top cases or the second top cases are bent along a curve having a predetermined curvature,
   wherein each of the first top cases comprises:
      an outer support covering an edge of the display panel;
      a first support protruding from the outer support to support a front surface of the display panel;
      a second support protruding from the outer support to support a rear surface of the back cover; and
      a third support protruding backward from the outer support to a position spaced part from the second support,
   wherein two or more coupling supports are provided on the third support to be bent from an edge of the third support,
   wherein the coupling supports are spaced apart from each other in a circumferential direction, such that the back cover and the coupling supports are coupled via fastening members, and
   wherein the back cover comprises rear stepped portions protruding backward, in positions corresponding to the coupling supports.

2. The display device according to claim 1, further comprising a magnet member provided on a front surface of the back cover to be coupled to an encapsulation member made of a magnetic material, provided on the rear surface of the display panel.

3. The display device according to claim 2, further comprising an adhesive member provided between the front surface of the back cover and a rear surface of the magnet member to prevent the magnet member from moving when pushed.

4. The display device according to claim 1, wherein edge surfaces of the display panel and the back cover are seated in a grooved panel seat between the first support and the second support.

5. The display device according to claim 1, wherein the second support comprises slits in positions corresponding to the rear stepped portions,
   the slits allowing bent portions provided on both sides of the rear stepped portions to be fitted thereinto and supported thereby.

6. The display device according to claim 1, wherein each of the second top cases comprises:
   a side support covering an end of the first top case, and
   a front support bent from a front edge of the side support to support the display panel.

7. The display device according to claim 6,
   wherein each of the second top cases comprises a rear support bent from a rear edge of the side support to support rear surfaces of the rear stepped portions of the back cover, such that the rear support is coupled to the back cover using a fastening member.

8. The display device according to claim 1, wherein a damper is provided between each first support and the display panel to compensate for a gap between each first support and the display panel.

* * * * *